(12) United States Patent
Schwartz

(10) Patent No.: US 9,171,603 B1
(45) Date of Patent: Oct. 27, 2015

(54) SENSOR READ/WRITE CIRCUIT AND METHOD

(71) Applicant: Palo Alto Research Center Incorporated, Palo Alto, CA (US)

(72) Inventor: David E. Schwartz, San Carlos, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 39 days.

(21) Appl. No.: 14/251,136

(22) Filed: Apr. 11, 2014

(51) Int. Cl.
| | |
|---|---|
| G11C 7/00 | (2006.01) |
| G11C 11/22 | (2006.01) |
| G11C 11/16 | (2006.01) |
| G11C 13/00 | (2006.01) |

(52) U.S. Cl.
CPC ........ G11C 11/2273 (2013.01); G11C 11/2275 (2013.01); G11C 11/2293 (2013.01); *G11C 11/1673* (2013.01); *G11C 13/004* (2013.01)

(58) Field of Classification Search
CPC ............ H04N 9/045; H04N 2209/049; H04N 5/2628; H04N 5/208; H04N 5/21; G11C 13/004; G11C 11/1673
USPC ........ 365/45, 64, 65, 129, 145, 174, 189.011, 365/189.15, 189.14, 189.16, 191
See application file for complete search history.

(56) References Cited

U.S. PATENT DOCUMENTS

| | | | |
|---|---|---|---|
| 6,320,512 B1 | 11/2001 | Nicholson et al. | |
| 6,788,033 B2 | 9/2004 | Vinciarelli | |
| 8,009,484 B2 * | 8/2011 | Furuta et al. | 365/189.04 |
| 9,042,152 B2 * | 5/2015 | Kim et al. | 365/129 |
| 2004/0212509 A1 | 10/2004 | Zweig | |
| 2007/0146529 A1 * | 6/2007 | Suzuki | 348/333.01 |
| 2013/0051114 A1 * | 2/2013 | Kim et al. | 365/145 |

FOREIGN PATENT DOCUMENTS

WO   WO 2007134061   11/2007

* cited by examiner

*Primary Examiner* — Fernando Hidalgo
(74) *Attorney, Agent, or Firm* — Hollingsworth Davis, LLC

(57) ABSTRACT

A sensor read/write circuit having a sensor, an integrator, a pulse generator, at least a first and second memory device, and a counter. The sensor senses a parameter and produces a sensor output representative of the sensed parameter. The sensor output is provided to the integrator which produces an integrated output representative of the sensed parameter. The integrated output triggers the pulse generator to produce a pulse which causes the first memory device to be written. The above sequence is repeated whereby a new sensor reading is generated and a second pulse causes the second memory device to be written but only if the first memory device has been substantially completely written, the first memory device has been subsequently disabled and the second memory device has been enabled.

24 Claims, 4 Drawing Sheets

SENSOR READ/WRITE CIRCUIT AND METHOD

STATEMENT REGARDING FEDERALLY SPONSORED RESEARCH AND DEVELOPMENT

This invention was made with government support under contract number RFP12-159 FlexTech Alliance. The U.S. Government has certain rights in this invention.

TECHNICAL FIELD

The present disclosure relates to a sensor read/write circuit and, more particularly, to a circuit that can read a parameter sensed by a sensor and write a value representing a total amount of integrated charge.

SUMMARY

Disclosed herein is a sensor read/write circuit having a sensor, an integrator, a pulse generator, at least a first and second memory device, and a counter. The sensor senses a parameter and produces a sensor output representative of the sensed parameter. The sensor output is provided to the integrator which produces an integrated output representative of the sensed parameter. The integrated output triggers the pulse generator to produce a pulse which causes the first memory device to be written. The above sequence is repeated whereby a new sensor reading is generated and a second pulse causes the second memory device to be written but only if the first memory device has been substantially completely written, the first memory device has been subsequently disabled and the second memory device has been enabled.

Variations of the above-described embodiment of the sensor read/write circuit may include a gain stage coupled between the integrator and the pulse generator. They may also include a delay stage coupled between the integrator and the counter. The sensor read/write circuit may additionally include a second pulse generator configured to trigger the counter and reset the integrator. Alternatively, a single pulse generator may be used to trigger the counter and reset the integrator. The memory devices of the sensor read/write circuit may include non-volatile memory devices such as ferroelectric memory cells. The sensed parameter of the sensor read/write circuit may be written to the memory devices in code, such as unary code. The sensor read/write circuit may be implemented on a flexible substrate or implemented with an additive or printed thin film transistor technology.

A procedure or method for reading and writing a sensed parameter according to various embodiments includes sensing a first parameter and producing a first output representative of that first parameter. The procedure further includes integrating the first output to produce a first output trigger representative of the first sensed parameter. The first output trigger operates to trigger a first pulse output. The procedure additionally includes enabling a first memory device and the first pulse output causing the enabled memory device to be written. Subsequently, a second parameter is sensed and a second output representative of the sensed parameter is produced. The procedure includes integrating the second output to produce a second output trigger representative of the second sensed parameter and using the second output trigger to trigger a second pulse output. The procedure further includes enabling a second memory device and the second pulse output causing the second memory device to be written only after the first memory device has been substantially completely written and subsequently disabled. The procedure may be repeated as necessary and appropriate to the application in which it is used.

The above-described procedure may further include adding gain to the first and second output triggers and/or delaying the first and second output triggers. The procedure may additionally include generating a reset pulse and/or storing the value of the first and second outputs in unary code.

The above summary is not intended to describe each embodiment or every implementation. A more complete understanding will become apparent and appreciated by referring to the following detailed description in conjunction with the following drawings.

DETAILED DESCRIPTION

Embodiments of the present disclosure are directed to circuits and methods that provide the capability to integrate a current signal, such as that generated by a sensor, and write to an array of memory cells a value representing the total amount of integrated charge. The value can be stored as unary code, with each bit in the memory array representing a certain amount of charge, Q, and the total number of bits written, m, give the total amount of charge integrated, m×Q. Bits are always written sequentially in a predetermined order. The embodiments are suited for printed flexible electronics but are transferrable to other forms of electronics.

Figure 1:
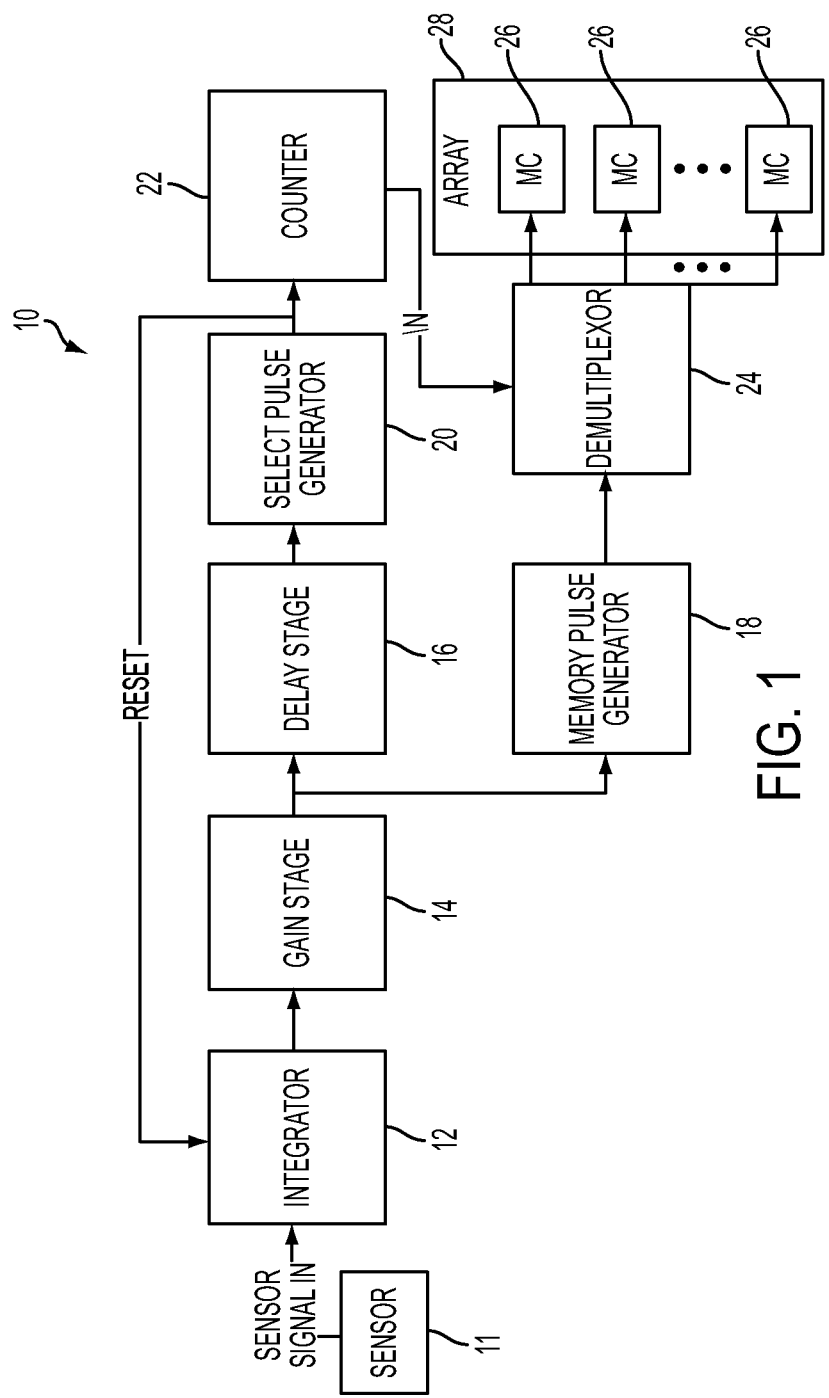
FIG. 1 is a block-diagram of a sensor read/write circuit according to an example embodiment.

In reference to FIG. 1, a block diagram illustrates the main components of a sensor read/write circuit 10 according to an example embodiment. As shown, the sensor read/write circuit 10 generally includes a sensor 11, an integrator 12, a gain stage 14 whose output is directed to both a delay stage 16 and a memory pulse generator 18, a select pulse generator 20, a counter 22, a demultiplexor 24 and an array 28 of memory cells 26. A single column array 28 is shown, however it should be noted that the array 28 may include as many rows and columns of memory cells as necessary for a specific application.

In operation, the sensor read/write circuit 10 of the example embodiment utilizes a sensor 11 that senses a parameter and produces an output current. The sensor 11 may be any type of sensor appropriate to an application that is capable of sensing a parameter and producing a current output that is representative of that parameter. The current output of the sensor 11 is provided as input to the integrator 12 on the line labeled "Sensor Signal in" in FIG. 1. The integrator 12 produces an output voltage signal that is a function of the magnitude and duration of the input current signal. The output voltage signal represents the amount of integrated charge. As such, the integrator 12 produces an output signal representative of the sensed parameter. The output of the integrator 12 is provided to the gain stage 14. The gain stage 14 operates to increase the slew rate of the edge of the signal output by the integrator 12. The subsequent pulse generators 18 and 20 typically require sharp signal edges from the integrator output in order to be triggered to generate pulses. However, a specific application of the sensor read/write circuit 10 may not require the use of a gain stage 14 if the sharpness on the signal edge out of the integrator 12 is sufficient to activate the pulse generators 18 and 20. As such, the gain stage 14 should be considered optional.

The output of the gain stage 14 is directed through two paths. The lower path provides an input signal to the memory pulse generator 18. The memory pulse generator 18 produces a pulse which is thereby provided to the demultiplexor 24. The demultiplexor 24 produces a single output signal on one of the "n memory word lines" that is provided to a single, enabled memory cell 26 within the array 28 of n memory cells 26, such that the bit of the memory cell 26 is written. The memory cell 26 may be any type of memory, including non-volatile memory, e.g., ferroelectric (FE) cells. After the memory cell 26 has been written, the sensor read/write circuit 10 automatically switches through use of counter 22 enabling a next, single memory cell 26 within array 28 to be written. The counter 22 may comprise any appropriate circuit that would produce the desired switching, for example, an RS-latch circuit. The signal to activate the counter 22 is found along the upper path of the output from gain stage 14. To prevent the counter 22 from switching and enabling the writing of a new memory cell 26 before the last memory cell 26 has been completely written, the output of the gain stage 14 is provided to a delay stage 16. The delay stage 16 slows the activation of the select pulse generator 20 providing the full time needed for a complete memory cell 26 write. Once the select pulse generator 20 has been activated, a pulse is produced at its output which activates the counter 22. Activation of the counter 22 results in enabling a new memory cell 26 with the capability to be written with a signal from the demultiplexor 24. The pulse from the select pulse generator 20 also operates to reset the integrator 12 allowing it to begin integrating a new input current along line "Sensor Signal in" from the sensor 11.

Figure 2:
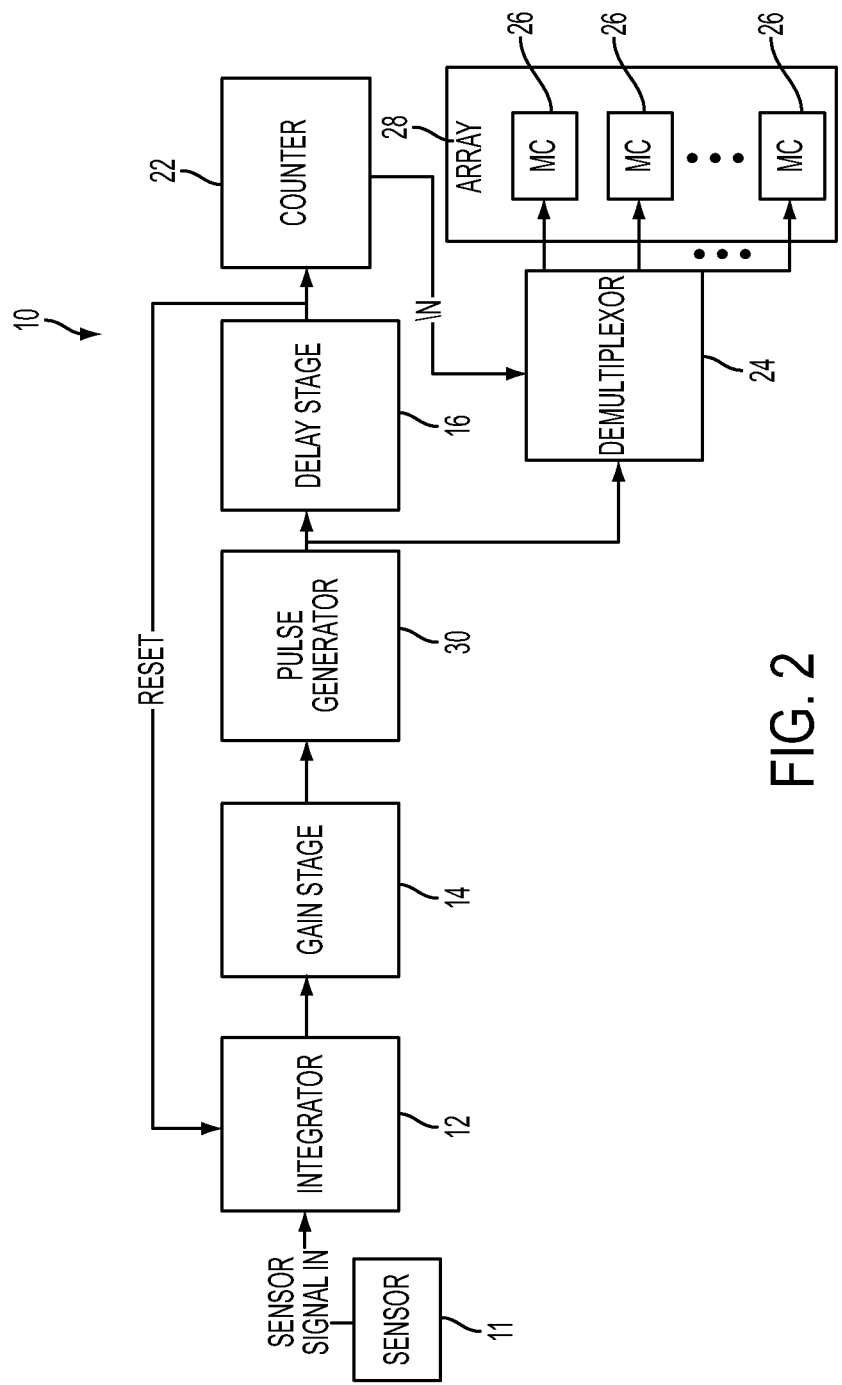
FIG. 2 is a block diagram of a sensor read/write circuit according to an example embodiment.

The sensor read/write circuit 10 of FIG. 1 utilizes two pulse generators, the memory pulse generator 18 and the select pulse generator 20. Two pulse generators may be useful if the counter 22 and the demultiplexor 24 require different pulse shapes, i.e., pulse widths, for activation. However, if different pulse shapes are not required, a single pulse generator may be used; see the example embodiment of sensor read/write circuit 10 in FIG. 2. Here, pulse generator 30 provides the same pulse signal to both the counter 22 and the demultiplexor 24 with the pulse signal to counter 22 subject to delay stage 16 ensuring a complete write of the memory cell 26 prior to a new memory cell 26 being enabled for writing. Otherwise, the sensor read/write circuit 10 of FIG. 2 operates similarly to the sensor read/write circuit of FIG. 1.

Figure 3:
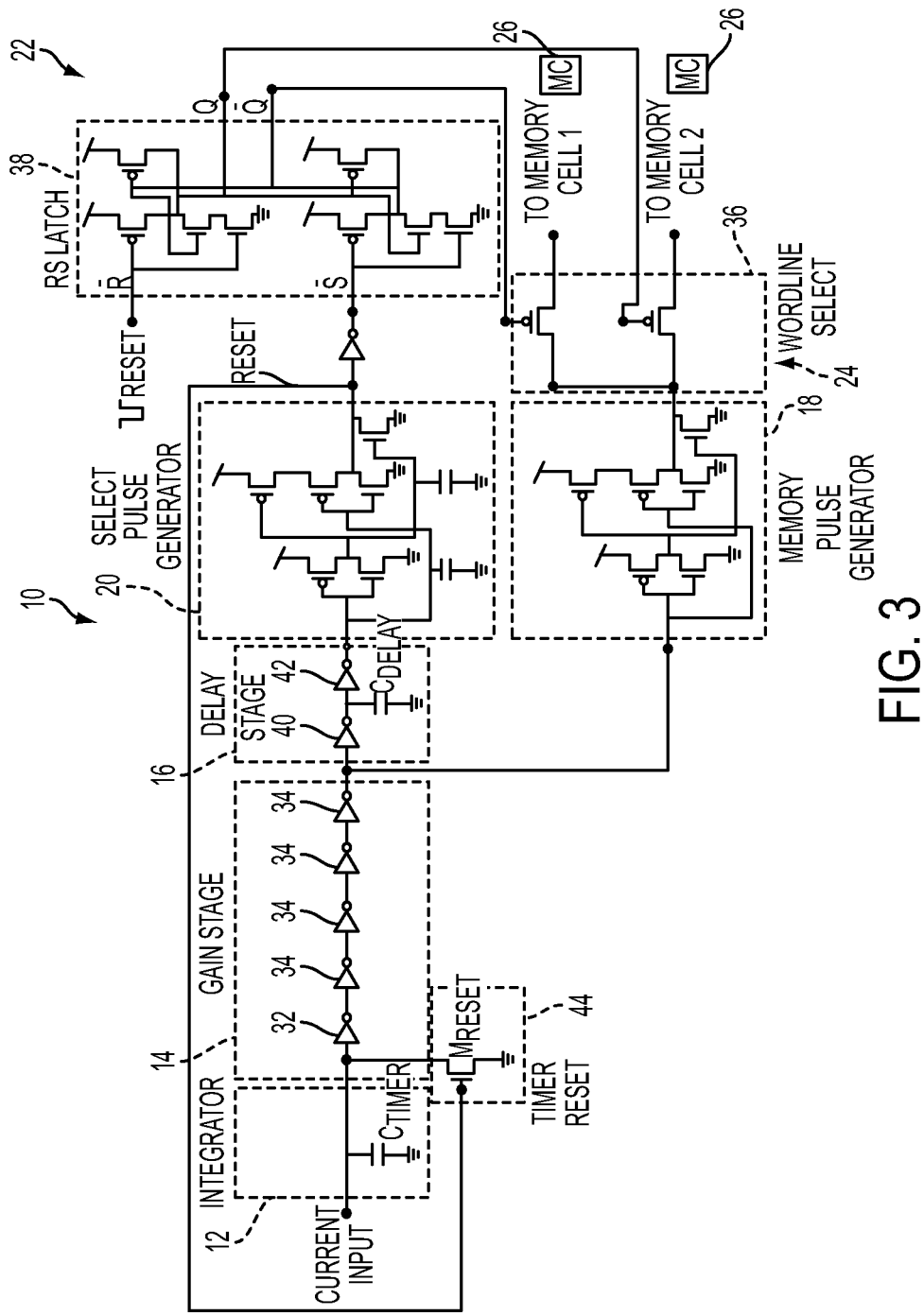
FIG. 3 is a schematic illustrating a sensor read/write circuit according to an example embodiment.

FIG. 3 provides a detailed schematic of an example embodiment of the sensor read/write circuit 10. As indicated, the sensor 11 (not shown) provides an input current to the integrator 12 which is comprised of a timer capacitor, $C_{timer}$. As those skilled in the art are aware, the integrator 12 maybe a single capacitor or a more complex circuit involving, for example, an operational amplifier. The input current is fed to the timer capacitor whereby the voltage at the input to the first inverter 32 in the gain stage 14 increases until it is above the threshold voltage of the first inverter 32. Upon surpassing threshold voltage of the first inverter 32, all remaining inverters 34 are triggered to switch. As such, the sensor read/write circuit 10 is essentially enabled "to go" or move forward in its operation. The time that it takes to reach "go" depends on the input current. As mentioned above, the gain stage 14 should be considered optional. If the gain stage 14 is to be used, the number of inverters used within the gain stage 14 is dependent upon the specific application in which the sensor read/write circuit 10 is employed. A sufficient number of inverters will provide the signal out of the gain stage 14 with an edge that is sharp enough to trigger the pulse generators 18 and 20. In this specific embodiment, the sensor read/write circuit 10 utilizes thin film transistor (TFT) technology; organic TFTs are very slow so a significant amount of gain is necessary. It should be further be noted that the gain stage 14 may comprise a chain of inverters, as shown, or a different circuit implementation that produces the desired output.

Continuing with reference to the example embodiment of FIG. 3, the edge output by the gain stage 14 is used to trigger the memory pulse generator 18, which in this specific embodiment is a monostable multivibrator circuit. While both the memory pulse generator 18 and the select pulse generator 20 are NAND or NOR based monostable vibrators as shown, other topologies of pulse generators are well known and may be used as appropriate. The output of the memory pulse generator 18 is passed to the word line select circuit 36. This circuit 36 serves as the demultiplexor 24 in that it passes the pulse to one and only one output, first memory cell 26. In this example embodiment, each memory cell 26 is configured to be written by a pulse input. Such a memory cell configuration may be provide by an FE memory cell with its second terminal held at ground; other memory cell configurations may be used as appropriate. The output is selected by the Q and Qbar signals from the RS latch circuit 38 described below. The pulse is passed to one and only one memory cell 26.

The RS latch circuit 38 can be thought of as a 2-bit one-hot counter circuit that performs the function of counter 22. Only one of Q and Qbar is high at a time. The RS latch is a conventional circuit and is well-documented in literature. In short, both Rbar and Sbar are normally kept in the high state. When a negative pulse is sent to the Rbar input, output Q is brought high, and Qbar low. When a negative pulse is sent to the Sbar input, output Q is brought low, and Qbar high. When the sensor read/write circuit 10 is first started up, a negative pulse is sent to Rbar so that Q is high and the first memory cell 26 is enabled. This negative pulse is provided from an outside source and is pulsed only when circuit 10 is turned on. Other topologies of counter circuits are well known and may be used as appropriate.

The output of the gain stage 14, in addition to triggering the pulse to write the first memory cell 26, also passes through the delay stage 16, to another pulse generator, the select pulse generator 20. The delay stage 16 utilizes capacitor $C_{delay}$ as its delay device where, after the output of the gain stage 14 passes through the inverter 40, charge builds on the capacitor and voltage increases until the threshold voltage of the inverter 42 is surpassed triggering select pulse generator 20. The select pulse generator is connected to the Sbar input of the RS latch circuit 38. It switches Q to low and Qbar to high thereby selecting a second memory cell 26. The output of the delay stage 16 also triggers the timer reset circuit 44, which comprises MOSFET $M_{reset}$. The timer reset circuit 44 resets the integrator 12 to its initial value (ground) and allows the next sensor 11 reading to occur. The next time the integrator 12 reaches the trigger voltage of the gain stage 14, second memory cell 26 is written. In this way, whether 0, 1, or 2 memory cells have been written indicates whether 0, 1, or 2 sensor readings have been received. As those skilled in the art are aware, the delay stage 16 may comprise an inverter chain, as shown in the instant case, optionally with added capacitance or resistance, or a reduced supply voltage, etc. Any appropriate means for generating the desired delay is acceptable.

The example embodiment of sensor read/write circuit 10 in FIG. 3 depicts a specific configuration for the counter 22, the RS latch circuit 38, and for the demultiplexor 24 and the wordline select circuit 36. However, it should be noted that the counter 22 and demultiplexor 24 may alternatively comprise a binary counter and decoder, or any other suitable topology. Further, the specific embodiment of FIG. 3 utilizes only two memory cells 26 for ease of explanation of the circuit 10. However, any number of memory cells 26 may be used as appropriate for the application.

Figure 4:
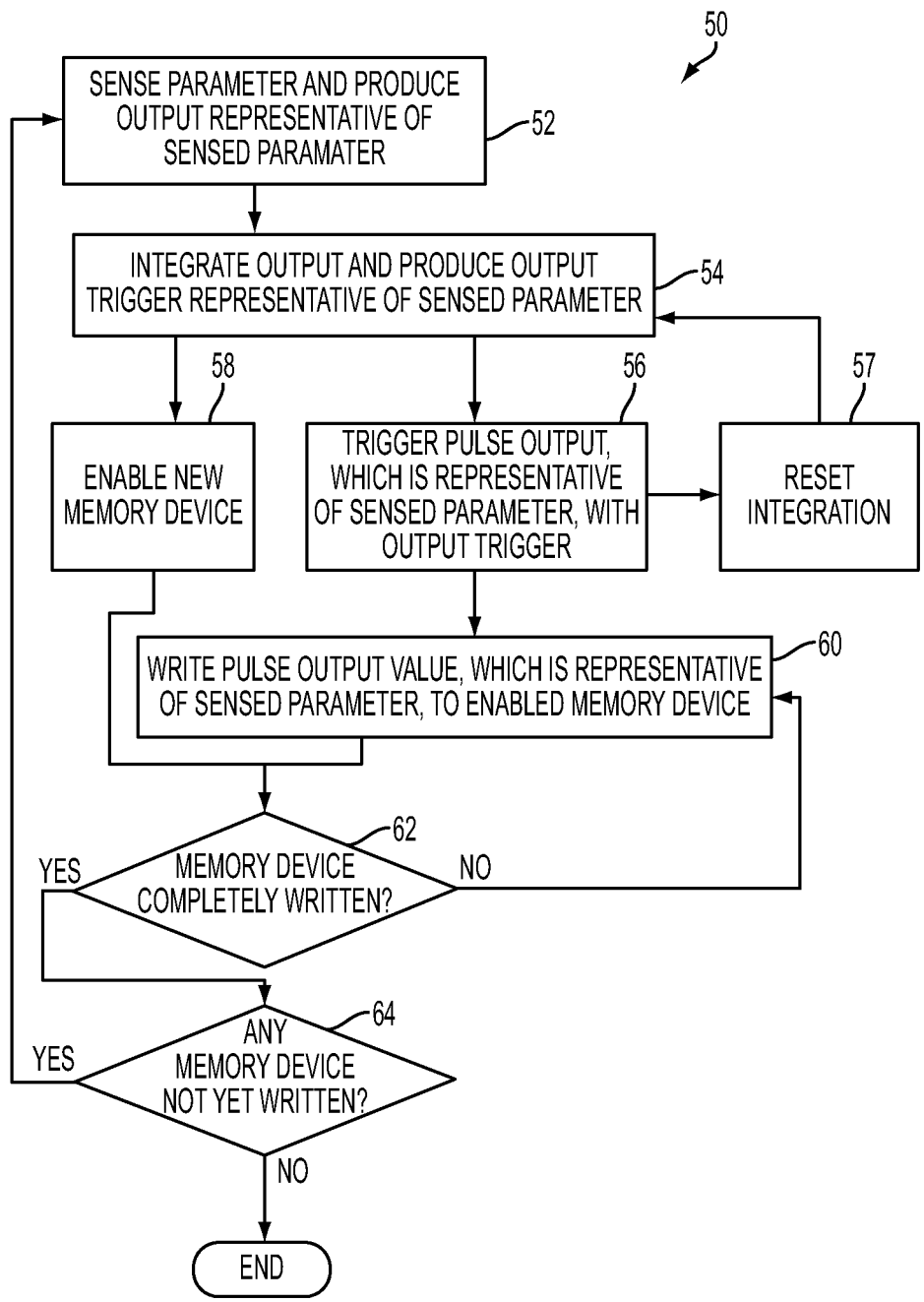
FIG. 4 is a flow chart illustrating a procedure according to an example embodiment.

FIG. 4 is a flowchart depicting an example procedure 50 for reading and writing a sensed parameter consistent with the sensor read/write circuit embodiments described above. The procedure includes sensing a parameter and producing an output representative of that parameter, per block 52. The produced output typically comprises an input current generated by any application appropriate sensor, e.g., a photosensor. The procedure of the example embodiment further includes integrating the output and producing an output trigger representative of the sensed parameter, per block 54. Based on the output trigger, a new memory device is enabled, per block 58, and a pulse output is produced, per block 56. The pulse output is used for an integration reset, as is shown in block 57, and causes the enabled memory device to be written in unary code, per block 60. Optionally, decision block 64 questions whether there is another remaining memory device that has not yet been written. If there is still another memory device available, control is returned to block 52 where the procedure starts all over again. If all memory devices have been written, the procedure is terminated. Alternatively, the circuit may keep sending the write signal to the last memory bit but, since the memory bit can be written only once, the signal has no effect.

Systems, devices or methods disclosed herein may include one or more of the features, structures, methods, or combination thereof described herein. For example, a device or method may be implemented to include one or more of the features and/or processes described herein but may be implemented to include selected features and/or processes that provide useful structures and/or functionality.

Various modifications and additions can be made to the disclosed embodiments discussed above. Accordingly, the scope of the present disclosure should not be limited by the particular embodiments described above, but should be defined only by the claims set forth below and equivalents thereof.

The invention claimed is:

1. A sensor read/write circuit comprising:
 a sensor configured to sense a first parameter and produce a first sensor output representative of the first parameter;
 an integrator configured to receive the first sensor output and produce a first integrator output representative of the first parameter;
 a pulse generator wherein the first integrator output triggers a first pulse from the pulse generator;
 a first memory device wherein the first pulse causes the first memory device to be written;
 a second memory device; and
 a counter configured to enable and disable the first and second memory devices, and wherein a second pulse representative of a second parameter sensed by the sensor is written to the second memory device only after the first memory device has been substantially completely written, subsequently disabled by the counter and the second memory device has been enabled by the counter.

2. The sensor read/write circuit of claim 1, wherein the type of parameter sensed by the sensor for the first parameter and the second parameter is the same.

3. The sensor read/write circuit of claim 1, further comprising a gain stage coupled between the integrator and the pulse generator.

4. The sensor read/write circuit of claim 1, further comprising a delay stage coupled between the integrator and the counter.

5. The sensor read/write circuit of claim 3, further comprising a delay stage coupled between the gain stage and the counter.

6. The sensor read/write circuit of claim 1, further comprising a second pulse generator, wherein the second pulse generator is configured to trigger the counter and reset the integrator.

7. The sensor read/write circuit of claim 1, wherein the pulse generator is configured to trigger the counter and reset the integrator.

8. The sensor read/write circuit of claim 1, wherein the first and second memory devices are non-volatile memory devices.

9. The sensor read/write circuit of claim 8, wherein the non-volatile memory devices are ferroelectric (FE) memory cells.

10. The sensor read/write circuit of claim 1, wherein the sensor read/write circuit is implemented on a flexible substrate.

11. The sensor read/write circuit of claim 1, wherein the sensor read/write is implemented with an additive or printed thin film transistor (TFT) technology.

12. The read/write circuit of claim 1, wherein a value of the first and second parameters is stored in unary code.

13. A method for reading and writing a sensed parameter, comprising:
 sensing a first parameter and producing a first output representative of the first sensed parameter;
 integrating the first output to produce a first output trigger representative of the first sensed parameter;
 triggering a first pulse output with the first output trigger;
 enabling a first memory device and the first pulse output causing the enabled first memory device to be written;
 sensing a second parameter and producing a second output representative of the second sensed parameter;
 integrating the second output to produce a second output trigger representative of the second sensed parameter;
 triggering a second pulse output with the second output trigger; and
 enabling a second memory device and the second pulse output causing the second memory device to be written only after the first memory device has been substantially completely written and subsequently disabled.

14. The method of claim 13, wherein the first and second sensed parameters are the same type of parameter.

15. The method of claim 13, further comprising adding gain to the first and second output triggers.

16. The method of claim 13, further comprising delaying the first and second output triggers.

17. The method of claim 13, further comprising generating a reset pulse.

18. The method of claim 13, wherein writing the first and second pulse outputs to the first and second memory devices, respectively, comprises storing a value of the first and second outputs in unary code.

19. A sensor read/write circuit comprising:
 a sensor configured to sense a first parameter and produce a first sensor output representative of the first parameter;

an integrator configured to receive the first sensor output and produce a first integrator output representative of the first parameter;

a pulse generator wherein the first integrator output triggers a first pulse from the pulse generator;

a first memory device wherein the first pulse causes the first memory device to be written;

a second memory device;

a counter configured to enable and disable the first and second memory devices, and wherein a second pulse relating to a second parameter sensed by the sensor is written to the second memory device only after the first memory device has been substantially completely written, subsequently disabled by the counter and the second memory device has been enabled by the counter; and a delay stage coupled between the integrator and the counter, wherein the delay stage is configured to produce a delay stage output and wherein the delay stage output is used to reset the integrator and activate the counter.

20. The sensor read/write circuit of claim 19, further comprising a gain stage coupled between the integrator and the pulse generator.

21. The sensor read/write circuit of claim 19, further comprising a second pulse generator, wherein the second pulse generator is coupled between the delay stage and the counter.

22. The sensor read/write circuit of claim 19, wherein a value of the first and second parameters is stored in unary code.

23. The sensor read/write circuit of claim 19, wherein the sensor read/write circuit is implemented on a flexible substrate.

24. The sensor read/write circuit of claim 19, wherein the sensor read/write circuit is implemented with an additive or printed thin film transistor (TFT) technology.

* * * * *